(12) United States Patent
Van Schuylenbergh et al.

(10) Patent No.: US 7,426,117 B2
(45) Date of Patent: Sep. 16, 2008

(54) CHIP ON A BOARD

(75) Inventors: Koenraad F. Van Schuylenbergh, Sunnyvale, CA (US); Eric Peeters, Fremont, CA (US); David K. Fork, Los Altos, CA (US); Thomas Hantschel, Wevelgem (BE)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 11/314,827

(22) Filed: Dec. 21, 2005

(65) Prior Publication Data
US 2007/0139899 A1 Jun. 21, 2007

(51) Int. Cl.
*H05K 7/00* (2006.01)

(52) U.S. Cl. .......................... 361/760; 29/842; 361/807

(58) Field of Classification Search .................. 361/760, 361/765, 807, 769; 29/842; 439/66, 71
See application file for complete search history.

(56) References Cited

U.S. PATENT DOCUMENTS

| | | | |
|---|---|---|---|
| 5,944,537 A | | 8/1999 | Smith et al. |
| 6,008,991 A * | | 12/1999 | Hawthorne et al. .......... 361/707 |
| 6,110,823 A * | | 8/2000 | Eldridge et al. ............. 438/660 |
| 6,232,149 B1 * | | 5/2001 | Dozier et al. ............... 438/117 |
| 6,330,164 B1 * | | 12/2001 | Khandros et al. ........... 361/760 |
| 6,339,534 B1 * | | 1/2002 | Coico et al. ................ 361/760 |
| 6,646,533 B2 * | | 11/2003 | Biegelson et al. ........... 336/192 |
| 6,815,961 B2 * | | 11/2004 | Mok et al. .................. 324/754 |
| 2006/0274512 A1 * | | 12/2006 | Brandenburg et al. ....... 361/760 |

OTHER PUBLICATIONS

"Nano-spring arrays for high density interconnect", David K. Fork, et al., Proceedings of the 2000 SPIE—The International Society for Optical Engineering, Micro-machined Devices and Components VI (vol. 4176) (pp. 226-235).

"UV-Tapes for Semiconductor Processing", Furukawa Electric, http://www.furukawa.co.jp/tukuru/pdf/uvtape e.pdf (4 pages), no date supplied.

"Room Temperature Vacuum Sealing Using Surface Activated Bonding Method", Toshihiro Itoh, Hironao Okada, Hideki Takagi, Ryutaro Maeda and Tadatomo Suga, Transducers '03, The 12th International Conference on Solid State Sensors, Actuators and Microsystems, Boston, Jun. 8-12, 2003, (pp. 1828-1831).

* cited by examiner

*Primary Examiner*—Michael C. Zarroli
(74) *Attorney, Agent, or Firm*—Fay Sharpe LLP (57) ABSTRACT

An integrated circuit (IC) die/substrate assembly includes an IC die and a substrate that are electrically coupled through an interconnect formed on the IC die. The IC die/substrate assembly further includes at least one coupling that facilitates maintaining an IC die/substrate gap definition between the IC die and the substrate.

20 Claims, 12 Drawing Sheets

CHIP ON A BOARD

BACKGROUND

The following generally relates to integrated circuits. It finds particular application to integrated circuit chip/substrate assemblies. More particularly, it is directed towards mounting integrated circuit chips on a substrate, for example, to maintain chip/substrate gap definition.

An integrated circuit (IC) generally is a relatively thin chip (e.g., silicon) consisting of at least two interconnected semiconductor elements, including active (e.g., transistors, etc.) and/or passive (e.g., resistors, etc.) elements. These elements can be analog or digital. Typically, an integrated circuit chip is classified as analog, digital, or mixed signal, depending on whether the interconnected semiconductor elements are analog, digital, or both analog and digital. Integrated circuits are used to create components such as microprocessors, digital memory, transceivers, etc. and have become ubiquitous in that they are used in computers, communication systems (e.g., cell phones, etc.), appliances (e.g., microwaves, etc.), transportation, manufacturing, etc., which are integral components of modern societies.

Traditionally, integrated circuits were packaged in ceramic flat packs, which provided reliability and compactness. More recent packaging techniques include dual in-line packages (DIPs), initially in ceramic and then in plastic, pin grid arrays (PGAs), leadless chip carriers (LCCs), and surface mount packaging. Surface mount technology (SMT), in general, occupies an area about 30-50% less than an equivalent DIP package, with a typical thickness that is 70% less than the equivalent DIP package. Surface-mount types of packaging include, Small-Outline Integrated Circuit (SOIC), Plastic Leaded Chip Carrier (PLCC), Thin Small-Outline Package (TSOP), Ball grid array (BGA), etc. packages. Various techniques are used to mount integrated circuit chips to a substrate, depending on the chip packaging. Examples of mounting techniques include through-hole (e.g., solder and wire wrap) and surface mount.

Integrated circuit chips can also be mounted upside-down in a flip chip configuration. In general, after cutting the wafer into individual dice, the chip is mounted upside down in or on the substrate and solder reflowed. An underfill process, similar to an encapsulation process, may subsequently be used to cover the sides of the die. StressedMetal technology is a convenient way to fabricate flip-chip interconnects. These interconnects can either be mechanically pressed against a board pad or be soldered to it. However, differential thermal expansion between the integrated circuit silicon and the organic board moves the interconnects around. With mechanical interconnects, mechanical contacts can slide over mating board pads. With soldered interconnects, the soldered contacts rely on in-plane spring compliance to take up runout. The mechanics of soldered springs are a function of a proper definition of the gap between the flip-chip chip and the board. If this gap is too close, the springs can be stretched out flat with little compliance left. If this gap is too far, some springs may not contact their respective board pad. Thus, there is an unresolved need to control the chip-to-board gap.

BRIEF DESCRIPTION

In one aspect, an integrated circuit (IC) die/substrate assembly is illustrated. The IC die/substrate assembly includes an IC die and a substrate that are electrically coupled through an interconnect formed on the IC die. The IC die/substrate assembly further includes at least one coupling that facilitates maintaining an IC die/substrate gap definition between the IC die and the substrate.

DETAILED DESCRIPTION

Figure 1:
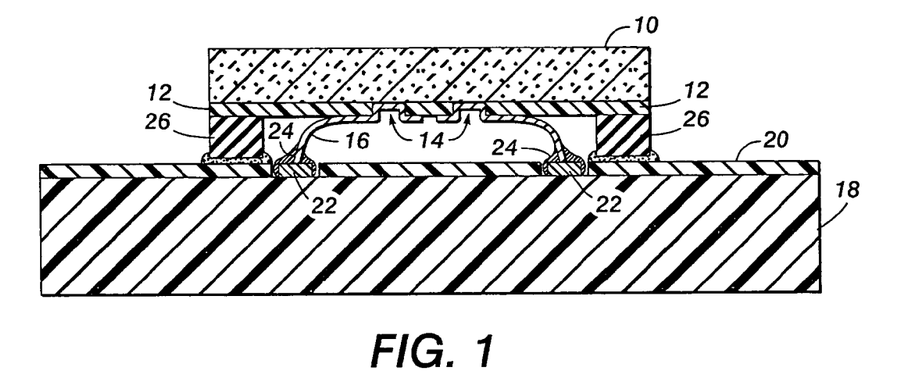
FIG. 1 illustrates an exemplary integrated circuit (IC) die/substrate assembly with a coupling that facilitates an IC die/substrate gap definition.

With reference to FIG. 1, an integrated circuit (IC) die/substrate assembly with at least one coupling that facilitates maintaining IC die/substrate gap definition is illustrated. The IC die/substrate assembly includes an IC die 10, which can include analog, digital, and/or mixed signal circuitry. A dielectric 12 is formed proximate the IC die 10 such that one or more portions 14 of the IC die 10 are exposed. Two portions 14 are depicted; however, in other instances one or more than two portions 14 can be formed. An interconnect 16 is electrically coupled to the one or more of the exposed portions 14 of the IC die 10. It is to be appreciated the interconnect 16 can be a conductive flexible spring (e.g., claw-type) interconnection or the like. In one instance, such spring interconnect is a stressed metal spring. In this instance, the spring can be biased out of the IC die 10 or a substrate plane by an internal mechanical stress.

The IC die/substrate assembly further includes a substrate 18, which can be a metal core, glass epoxy, silicon, ceramic (e.g., thick and thin film), Flame Resistant 4 (FR4), etc. single or multi-layer printed circuit board, or PCB. As depicted, an optional mask 20 is formed proximate the substrate 18. It is to be understood that the mask 20 is not required in all instances and, in some embodiments, is not used (e.g., when using an alumina hybrid PCB). However, for explanatory purposes the mask 20 is illustrated and described herein. The mask 20 is formed such that one or more portions 22 of the substrate 18 are exposed. Two portions 22 are depicted; however, in other instances one or more than two portions 22 can be formed. The interconnect 16 is also electrically coupled to the one or more exposed portions 22 of the substrate 18. As depicted, the interconnect 16 can be soldered to the one or more portions 22. In one instance, solder 24 can be applied to the one or more exposed portions 22 of the substrate 18 and a solder reflow technique is used to solder the interconnect 16 to the one or more exposed portions 22. Alternatively, a solder-free technique can be used to couple the interconnect 16 to the one or more portions. For instance, solder-free mechanical contacts can be used to couple the interconnect 16 to the one or more portions.

The interconnect 16, via the connection to the one or more of the exposed portions 14 of the IC die 10 and the one or more exposed portions 22 of the substrate 18, electrically couples the IC die 10 and the substrate 18. As depicted, the IC die 10 can be mounted to the substrate 18 in a flip chip configuration.

At least one coupling 26 can be used to facilitate maintaining the gap definition between the IC die 10 and the substrate 18. Two couplings 26 are depicted; however, in other instances one or more than two couplings 26 can be used. The at least one coupling 26 can be coupled to the dielectric 12 prior to mounting the IC die 10 to the substrate 18 and/or prior to wafer dicing. An adhesive such as glue, tape, etc. can be used to mount the at least one coupling 26 to the dielectric 12. The adhesive typically is applied to selective areas of the dielectric 12 such that it does not run along an entire perimeter of the dielectric 12. This mitigates trapping air, moisture, and/or corrosion caused by the moisture between the IC die 10 and the substrate 18, for example, that can develop from large pressure swings under varying temperatures and/or condensation in non-vented cavities. In some instance, the adhesive is applied as one or more layers and/or strips.

A similar and/or different adhesive can be dispensed on the optional mask 20 prior to mounting the IC die 10 to the substrate 18. Alternatively, the adhesive can be applied after solder reflow at a seam between the at least one coupling 26 and the optional mask 20 (e.g., where it wicks in and creates a bond). The latter example mitigates exposing the adhesive to elevated reflow temperatures.

The at least one coupling 26 can be flexible and absorb run-out due to thermal mismatch between the IC die 10 and the substrate 18. In addition, at least one coupling 26 can absorb external forces that would otherwise shear the IC die 10 from the substrate 18 (e.g., when installing a memory module in a desktop computer). In one aspect, the at least one coupling 26 can be flexible single-sided tape that absorbs thermal run-out at a perimeter of the IC die 10. In this instance, the single-sided tape is taped to the dielectric 12 and glued to the optional mask 20. In another aspect, the at least one coupling 26 can be a polymer standoff processed on the IC die 10 prior to dicing.

During assembly of the IC die/substrate assembly, the at least one coupling 26 can be used as a mechanical stop and solder paste can be used to hold the IC die 10 in place until solder reflow. Once assembled, the at least one coupling 26 provides a mechanical anchorage between the IC die 10 and the substrate 18, even under various types of impact, and facilitates maintaining gap definition between the IC die 10 and the substrate 18. In addition, the at least one coupling 26 mitigates restriction near the die perimeter (where the thermal run-out typically is largest), which reduces stress buildup. Furthermore, the at least one coupling 26 allows the IC die/substrate assembly to be relatively easily reworked. For instance, the IC die 10 can be relatively easily removed from the substrate 18. Using one or more adhesives that release under heat or UV exposure can facilitate reworking the IC die/substrate assembly. Moreover, the at least one coupling 26 can reduce the number of assembly steps by mitigating acts such as applying underfills, potting compounds, and the like.

Figure 2:
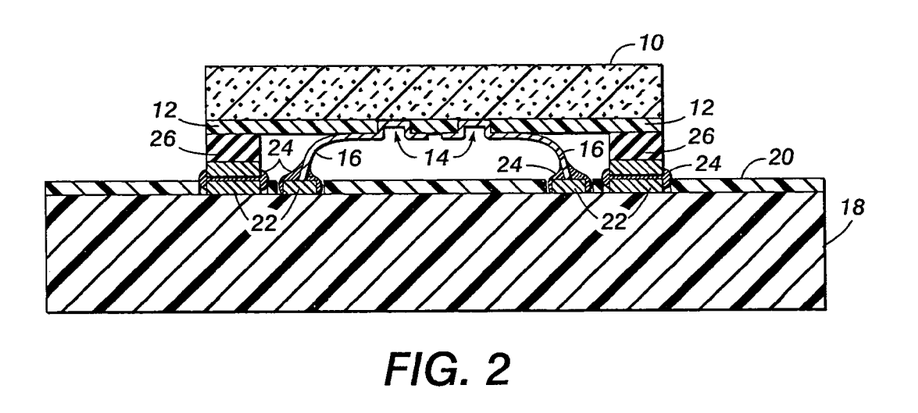
FIG. 2 illustrates another exemplary integrated circuit (IC) die/substrate assembly with a coupling that facilitates an IC die/substrate gap definition.

FIG. 2 illustrates an IC die/substrate assembly with at least one coupling that facilitates maintaining IC die/substrate gap definition. The IC die/substrate assembly includes the IC die 10 with the dielectric 12, the substrate 18 with the optional mask 20, and the interconnect 16, which electrically couples the IC die 10 and the substrate 18. The IC die 10 includes the one or more exposed portions 14 (two in this example) to which the interconnect 16 is coupled.

The optional mask 20 is formed adjacent to the substrate 18 such that one or more portions 22 of the substrate 18 are exposed. In this example, four portions 22 are depicted. The interconnect 16 is electrically coupled at least one (two in this example) of the one or more exposed portions 22 of the substrate 18. As described above, the interconnect 16 can be soldered to the at least one of the one or more portions 22. A pressure contact can alternatively be used between the interconnect 16 and the one or more portions 22. The mechanical coupling can be formed from solder or similar material. Connecting the at least one interconnect 26 to both the IC die 10 and the substrate 18 electrically couples the IC die 10 to the substrate 18. As depicted, the IC die 10 can be mounted to the substrate 18 in a flip chip configuration.

The at least one coupling 26 (two in this example) is used to facilitate maintaining die/substrate gap definition between the IC die 10 and the substrate 18. In this example, the at least one coupling 26 is flexible and metalized (e.g., a flexible metalized standoff) and is coupled to the dielectric 12 prior to mounting the IC die 10 to the substrate 18 and/or prior to wafer dicing. In one instance, the at least one coupling 26 can be soldered to at least one of the one or more portions 22 that have not been coupled to the interconnect 16. For example, solder 24 can be applied to the at least one of the one or more portions 22. The IC die 10 can then be suitably positioned with respect to the substrate 18, wherein the solder 24 between the at least one coupling 26 and the substrate 18 holds the IC die 10 firmly in place. The at least one coupling 26 is then coupled to the substrate 18 via solder reflow.

With conventional surface mount technology (SMT), it is desired to use the surface tension of melted solder to automatically self-align components. However, such self-alignment typically does not suitably occur when the terminals of the component are relatively small. Thus, in instances where the interconnect 16 includes relatively small terminals, this technique may not provide suitable self-alignment. The flexible metalized at least one coupling 26 in the instant example can be selected to create enough solder surface tension to facilitate self alignment of the IC die 10 and the substrate 18, regardless of the size of the terminals on the interconnect 16. During reflow, the surface tension makes the IC die 10 behave like a conventional self-aligning SMT component. After assembly and reflow, the at least one coupling 26 absorbs thermal run-out and external forces that may shear the IC die 10 off the substrate 18.

Figure 3:
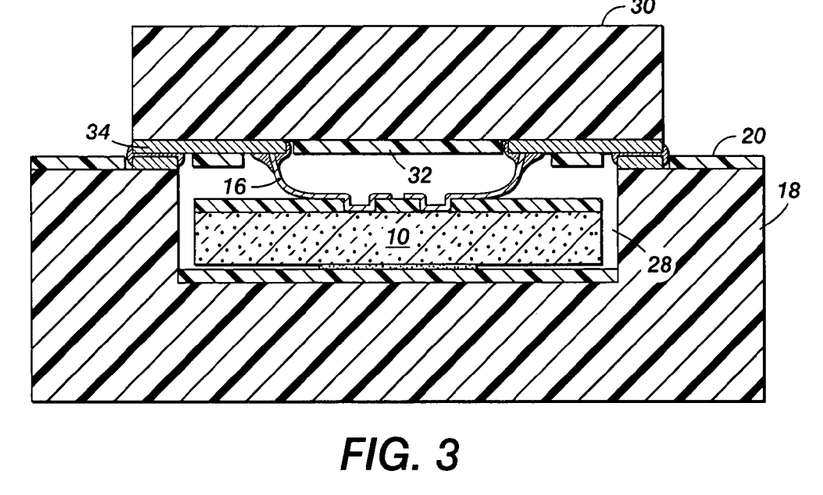
FIG. 3 illustrates an exemplary IC die/substrate assembly with a lid that protects the IC die from external forces.

FIG. 3 illustrates another IC die/substrate assembly with a lid to provide further protection to protect the IC die from external forces. The assembly includes the substrate 18, which can be a single or multi-layer PCB as described above. In this example, the substrate 18 includes a trench (or via) 28, which can be formed in one or more layers of the substrate 18. The optional mask 20 can be formed proximate the substrate 18, including the within the trench 28, such that one or more portions of the substrate 18 are exposed.

The assembly further includes the IC die 10, which is electrically coupled to a second substrate 30 in a flip chip configuration, for example, via the interconnect 16. Similar to the substrate 18, the second substrate 30 can be a metal core, glass epoxy, ceramic, silicon, Flame Resistant 4 (FR4), etc. single or multi-layer printed circuit board, or PCB. The second substrate 30 includes an optional mask 32 formed proximate the second substrate 30 to reveal one,or more portions 34 of the second substrate 30. Similar to the optional mask 20, the optional mask 32 may not be employed in various instances. For example, the optional mask 32 may not be employed when using pressure contacts. The IC die 10 can be coupled to the second substrate 30, as depicted, wherein the interconnect 16 is coupled to two of the one or more portions 34, for example, via solder.

The second substrate 30 is coupled to the substrate 18 such that the IC die 10 resides at least partially within the trench 28. Such coupling can be achieved by coupling at least one of the portions 34 of the second substrate 18 to at least one of the exposed portions of the substrate 18. This coupling can be achieved through various techniques, including surface mount. With this configuration, a single pass assembly and reflow of IC die 10 is possible. The IC die 10 is electrically coupled to the substrate 18 through the second substrate 30. For instance, the IC die 10 can be electrically coupled to the second substrate 30 via the interconnect 16, and the second substrate 30 can include at least one conductive path from the interconnect 16 to the coupling with the portions of the substrate 18.

The second substrate 30 acts as a lid (or cap) that protects the IC die 10 within the trench 28. It is to be appreciated that the substrate 18 and/or the second substrate 30 can include a copper ground layer (not shown) to provide shielding against electromagnetic interference (EMI). Typically, the side of the IC die 10 facing the substrate 18 within the trench 28 is not attached thereto. However, an adhesive such as glue, tape, etc. can be used to facilitate absorbing impact. In one instance, such adhesive is a relatively small volume of glue placed about a center of the side of the IC die 10 facing the substrate 18. The portion of the IC die 10 surface facing the substrate 18 and not coupled to the substrate 18 can slide freely over the substrate 18 to avoid thermally induced stresses. The second substrate 30 can be thermally matched to the substrate 18 to accommodate lids running over multiple IC dies.

Figure 4:
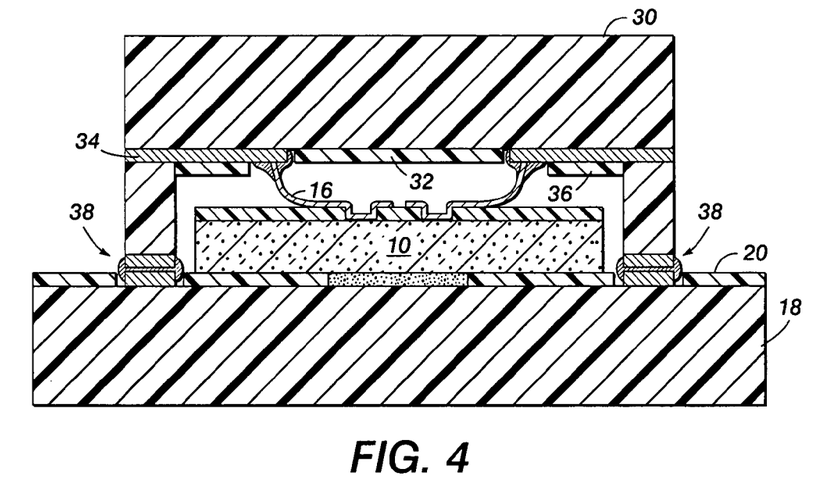
FIG. 4 illustrates another exemplary IC die/substrate assembly with a lid that protects the IC die from external forces.

FIG. 4 illustrates another IC die/substrate assembly with a lid to provide further protection to protect the IC die from external forces. The IC die/substrate assembly includes the second substrate 30, which can be a single or multi-layer PCB constructed form various materials as described herein. In this example, the second substrate 30 includes a trench (or cut-out) 36 formed in one or more layers of the second substrate 30. The optional mask 32 is formed proximate the second substrate 30, leaving the one or more expose portions 34. The IC die 10 is electrically coupled within the trench 36 of the second substrate 30 in a flip chip configuration as described in connection with FIG. 3 via the interconnect 16 and two of the one or more portions 34, for example, via solder.

The optional mask 20 is formed over the substrate 18, leaving one or more exposed portions 38. The second substrate 20, and hence the IC die 10, is coupled to the substrate 18. Such coupling can be achieved by coupling at least one of the portions 34 of the second substrate 18 to at least one of the portions 38 of the substrate 18. This coupling can be achieved through various techniques, including surface mount. The IC die 10 is also coupled to the substrate 18. For example, an adhesive such as glue, tape, etc. can be pre-dispensed on at least one of the one or more portions 38 that faces the IC die 10. The portion 38 that the glue is dispensed over can be formed within the optional mask 20 to prevent excessive spreading of the glue. In instances where the optional mask 20 is not used, the IC die 10 can be glued directly to the substrate 18. When the second substrate 30 is coupled to the substrate 18 via the portions 34 and 38, the IC die 10 can also be coupled to at least one of the portions 38. In one instance, such adhesive is a relatively small volume of glue. The portion of the IC die 10 coupled to the substrate 18 can be coupled to allow the uncoupled portions of the IC die 10 facing the substrate 18 to freely slide over the substrate 18 to avoid thermally induced stresses.

The IC die 10 is electrically coupled to the substrate 18 through the second substrate 30 as described in connection with FIG. 4. For example, the IC die 10 can be electrically coupled to the second substrate 30 via the interconnect 16, and the second substrate 30 can include at least one conductive path from the interconnect 16 to the coupling with the portions 34 of the substrate 18. The second substrate 30 acts as a lid that protects the IC die 10 within the trench 36. It is to be appreciated that the substrate 18 and/or the second substrate 30 can include a copper ground layer (not shown) to provide shielding against electro-magnetic interference (EMI).

Figure 5:
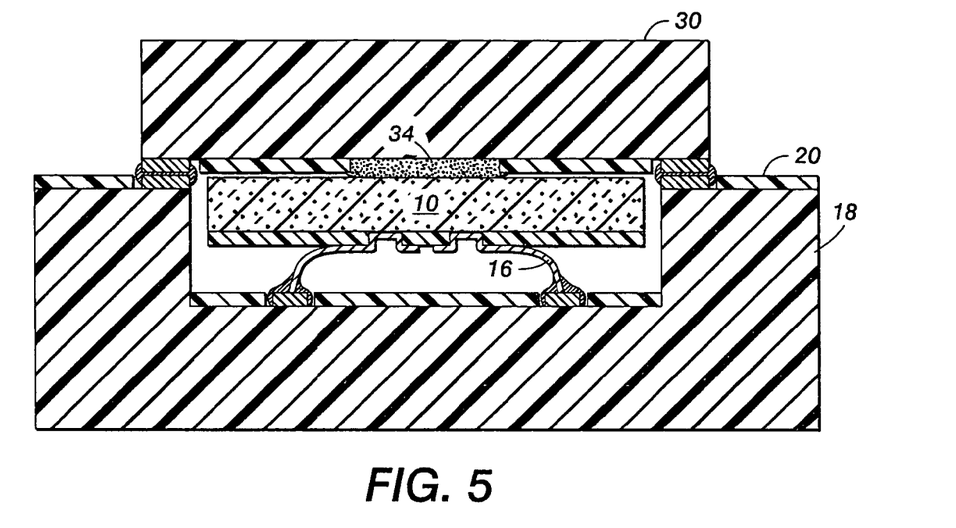
FIG. 5 illustrates an exemplary IC die/substrate assembly with a cap that protects an IC die residing within a trench in the cap.
Figure 6:
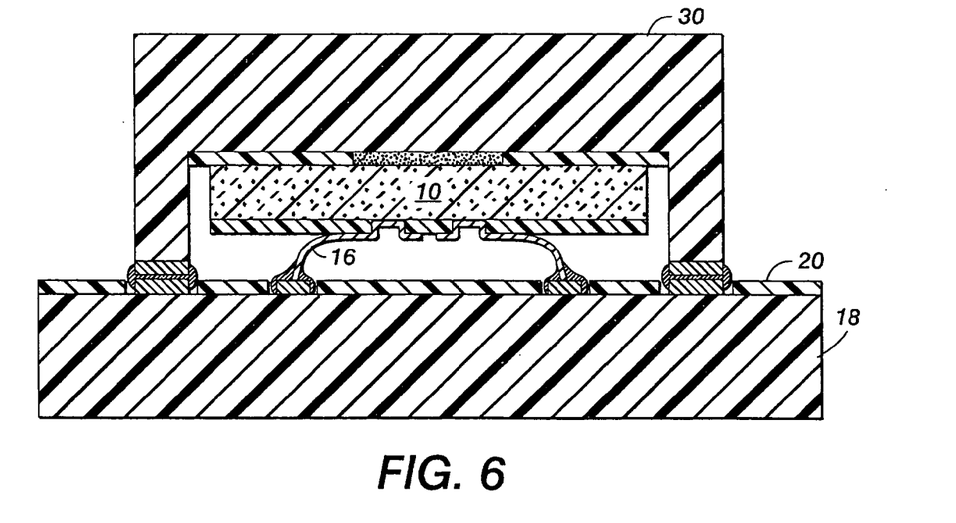
FIG. 6 illustrates an exemplary IC die/substrate assembly with a cap that protects an IC die residing within a trench in a substrate.

FIGS. 5 and 6 illustrate IC die/substrate assemblies. The IC die/substrate assembly in FIG. 5 is similar to the IC die/substrate assembly described in connection with FIG. 3, except that the IC die 10 is coupled to the substrate 18 (within the trench 28), rather than to the second substrate 30, through the interconnect 16, and the IC die 10 is coupled to the second substrate 30 via an adhesive at one or more of the exposed portions 34. The IC die/substrate assembly in FIG. 6 is similar to the IC die/substrate assembly described in connection with FIG. 4, except that the IC die 10 is coupled to substrate 18, rather than to the second substrate 30, through the interconnect 16, and the IC die 10 is coupled to the substrate 30 within the trench 36 via an adhesive. With both of these configurations, the backside of the IC die 10 is free to slide with respect to the second substrate 30 to avoid thermally induced stress. Glue or other adhesive (not shown) can optionally be used between the IC die 10 and the second substrate 30 to facilitate absorbing impact. In instances where the second substrate 30 is attached to the substrate 18 using solder, these configurations enable a one-pass reflow of IC die 10 and lid (the second substrate 30), and shielding ground planes can be included in the lids. In other instances, the second substrate 30 can be attached to the substrate 18 via one or more adhesives such as glue, tape, etc. By mounting the IC die 10 to the substrate 18 via the interconnect 16, the substrate 18 can be tested and reworked before coupling the second substrate 30.

Figure 7:
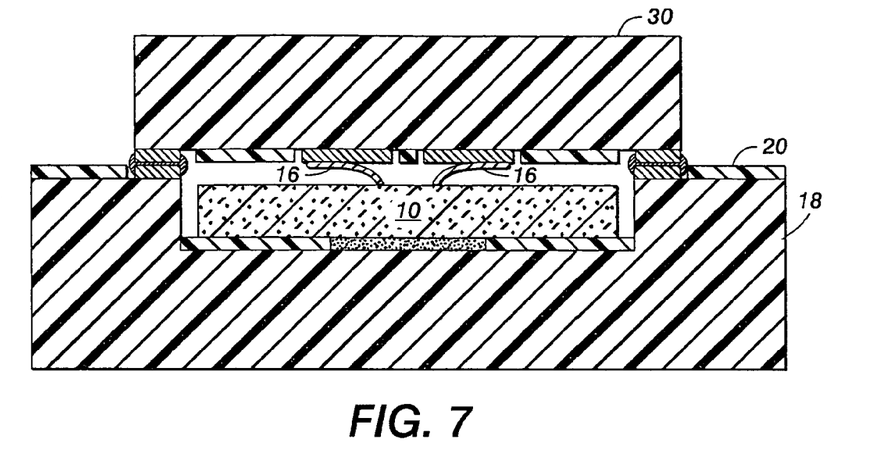
FIGS. 7-10 illustrate exemplary IC die/substrate assemblies with an interconnection mounted to a substrate or cap rather than the IC die.
Figure 8:
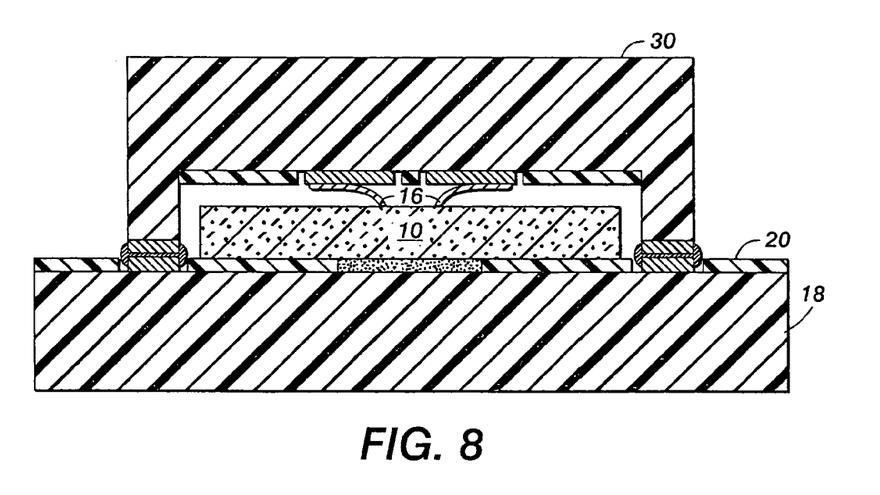
Figure 9:
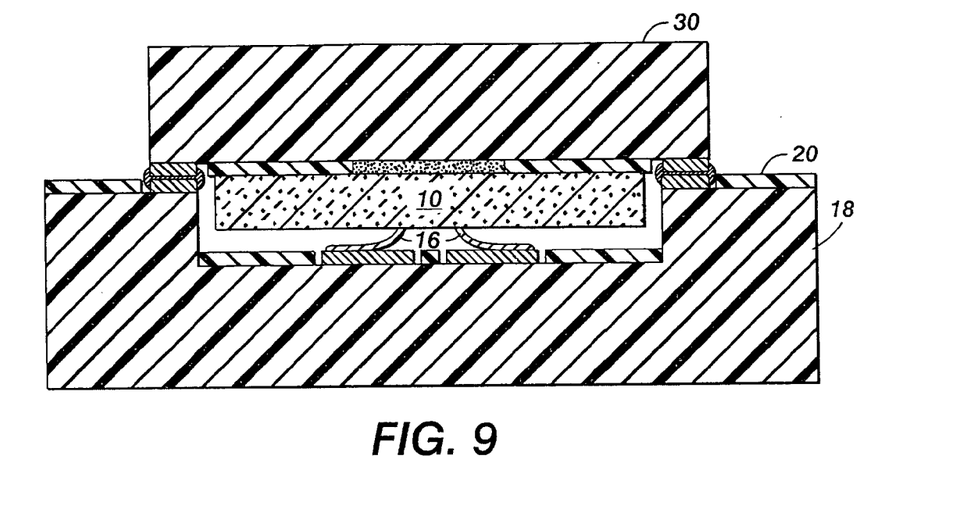
Figure 10:
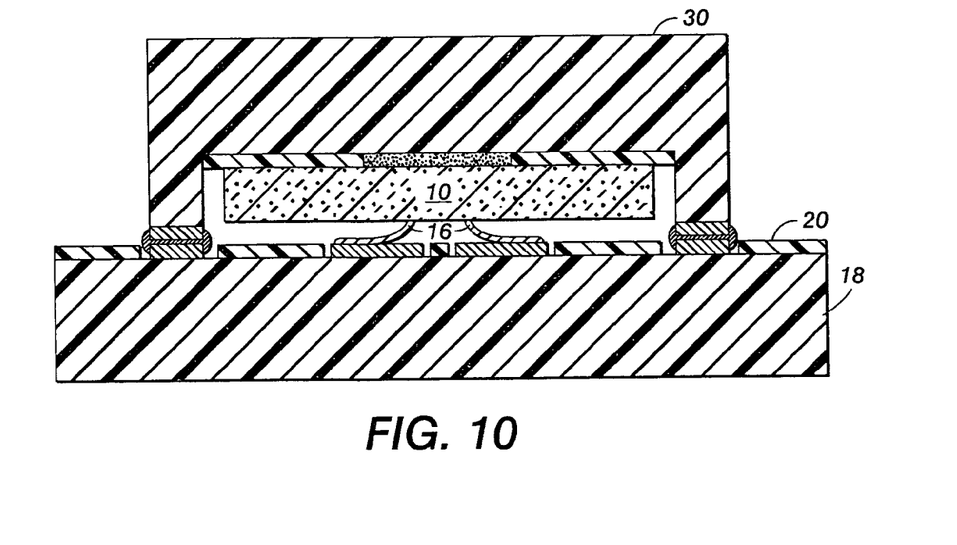

FIGS. 7, 8, 9, and 10 illustrate IC die/substrate assemblies similar to FIGS. 3, 4, 5, and 6, respectively, except that the interconnection 16 is attached to the second substrate 30 (as with FIGS. 7 and 8) or the substrate 18 (as with FIGS. 9 and 10) instead of the IC die 10, and the IC die 10 can be a conventional IC chip (e.g., conventional silicon chips with pads). This technique provides reliable solder-free pressure contacts for the unmodified conventional IC chip 10. With this configuration, the IC chip pads can be relatively smoother than the pads on the substrates 18 and 30 and the interconnect 16 can be relatively smaller, as they slide freely over the IC pads, to take up thermal run-out. In addition, the interconnect 16 may provide vertical and/or horizontal compliance, depending on the application. The interconnect 16 can also be pressed flat against the IC die 10, which further eases the die-to-substrate gap control. By attaching the interconnect 16 to the second substrate 30, as depicted in FIGS. 7 and 8, it can be fabricated with a fairly high density of interconnect/area, and, therefore, at a lower cost. For example, the area of fabrication could be about 1 m×1 m using PCB scale plating baths, etc. In addition, such configuration avoids the lower density and "non-standardness" associated with other configurations.

Figure 11:
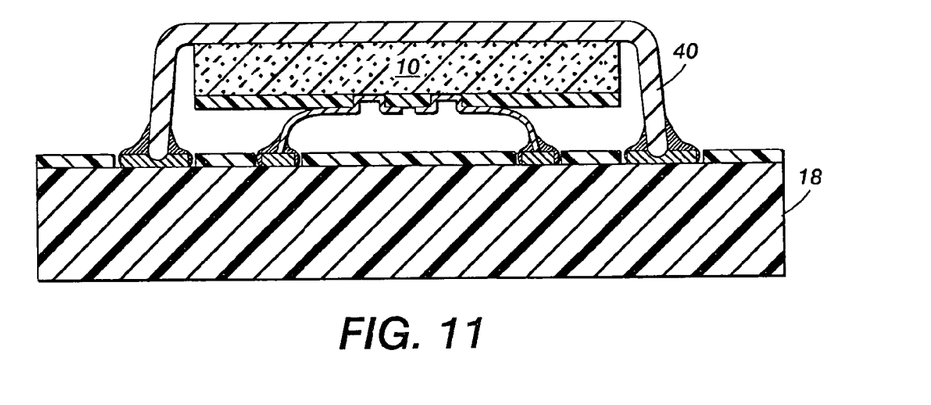
FIGS. 11-13 illustrate exemplary IC die/substrate assemblies in which the IC die is secured to the substrate via a cap.
Figure 12:
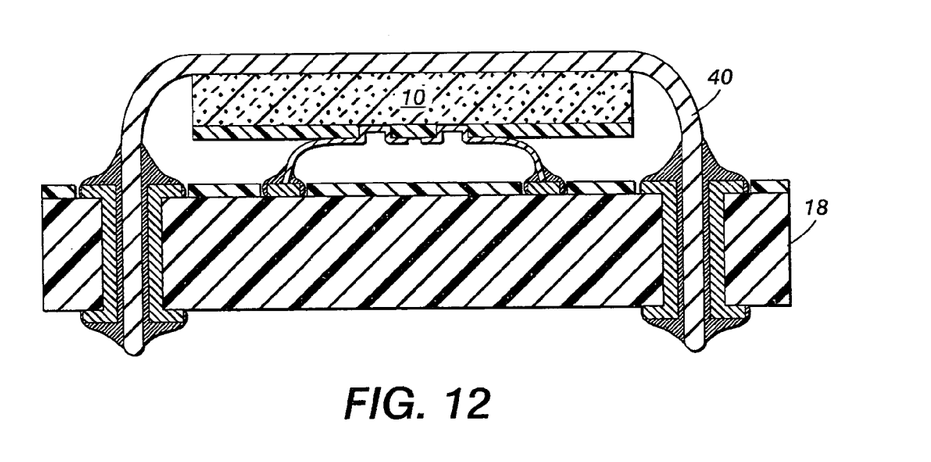
Figure 13:
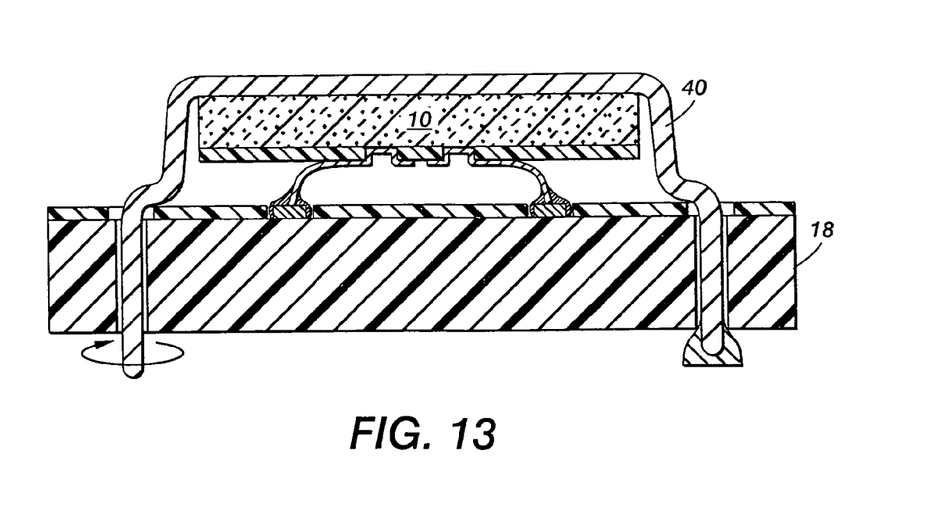

FIGS. 11, 12, and 13 illustrate variations of FIG. 1 in which the IC die 10 is secured (in addition to the interconnect 16) to the substrate 18 with a cap 40. In one instance, the cap 40 can be a stamped sheet metal cap or the like. In addition, the cap 40 can be formed from or coated with a solder wetable metal, which enables a single pass reflow of the IC die 10 and the cap 40. The backside of the IC die 10 can freely slide over a surface of the cap 40 to reduce thermally induced stress. An optional portion of an adhesive such as a glue can be placed on the IC die 10 (e.g., at about a center of the IC die 10) to facilitate absorbing impact.

The IC die/substrate assembly can be relatively easily tested and reworked if necessary before connecting the cap 40. Grounding the cap 40 can provide EMI shielding. The cap 40 can also be used as a heat spreader. In addition, a heat sink compound can be applied to the cap 40 to reduce the thermal die-cap resistance. The compound can be a soft compound that remains soft over the entire operation range to avoid thermally induced stresses. The cap 40 is depicted as covering a single IC die 10; however, it can be used to cover an array of IC dies, for example, with proper mechanical decoupling of the substrate 18 and the cap 40 to absorb the thermal run-out where the cap 40 mounts to the substrate 18. In FIG. 11, the cap 40 is mounted to the substrate 18 via surface solder-mount, in FIG. 12, the cap 40 is mounted to the substrate 18 via a through-hole solder-mount, and in FIG. 13, and the cap 40 is mounted to the substrate 18 via a through-hole twist-mount.

Figure 14:
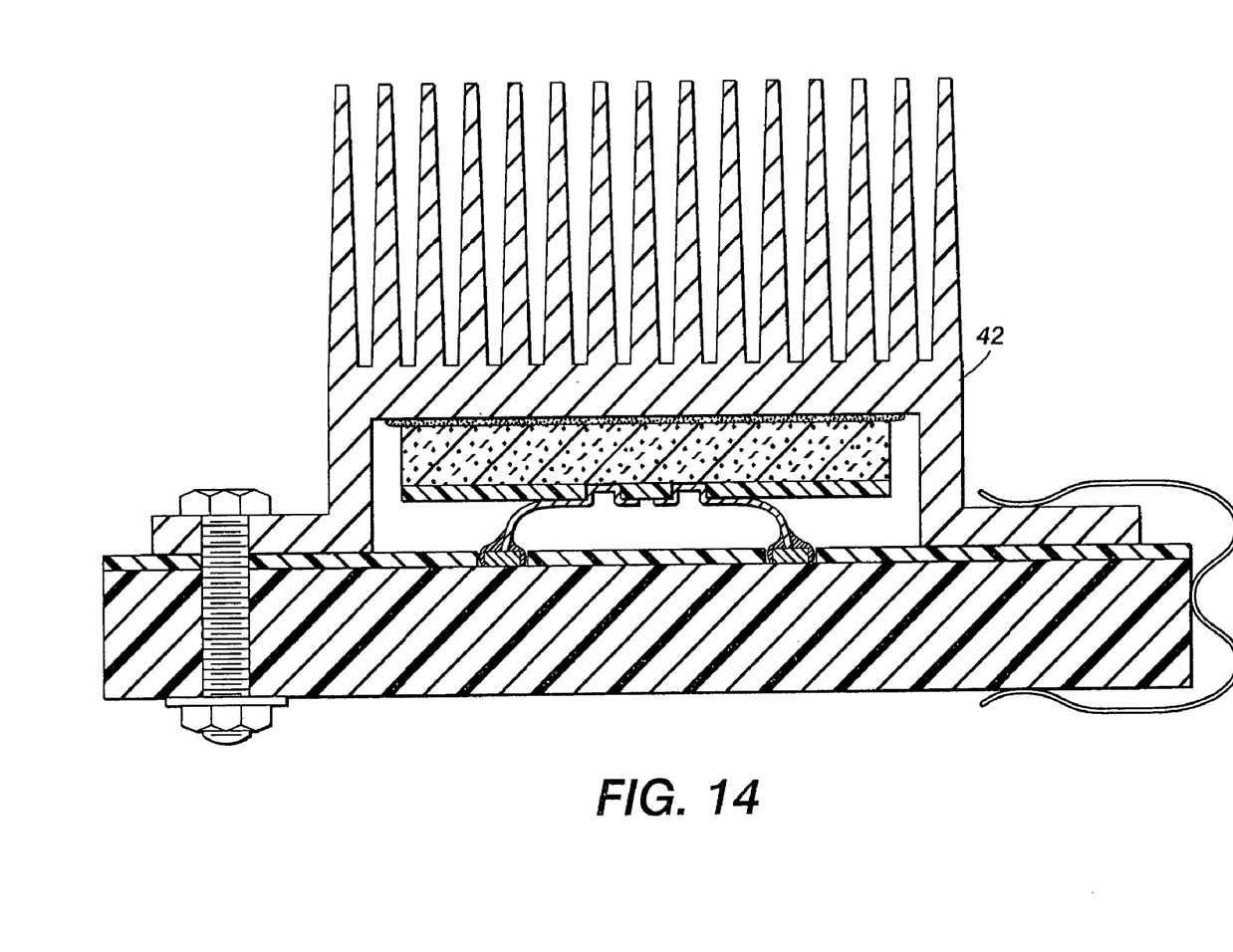
FIGS. 14-15 illustrate exemplary IC die/substrate assemblies in which a heat sink is used as a cap.
Figure 15:
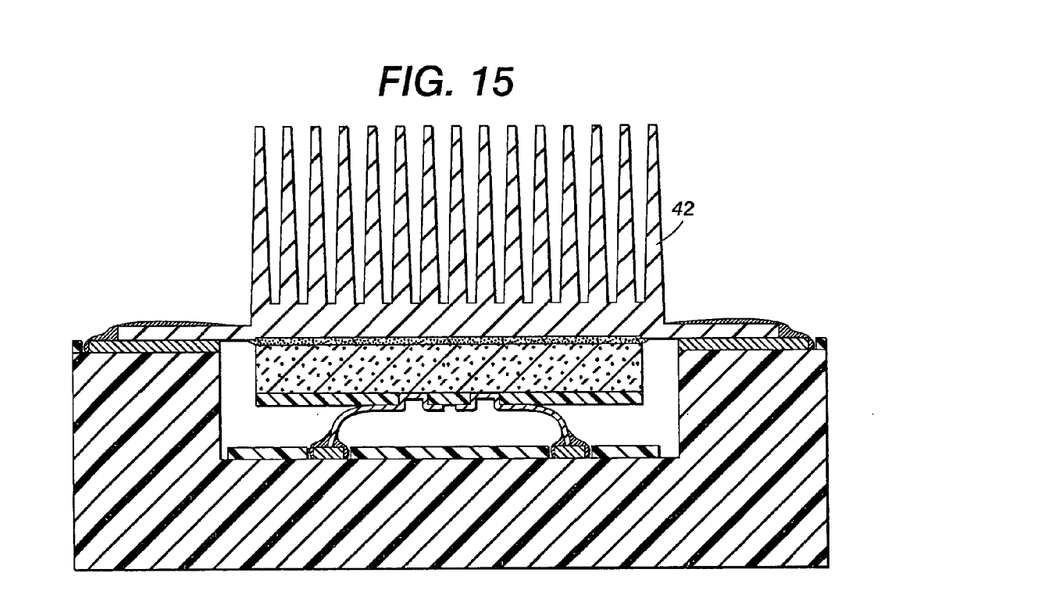
Figure 18:
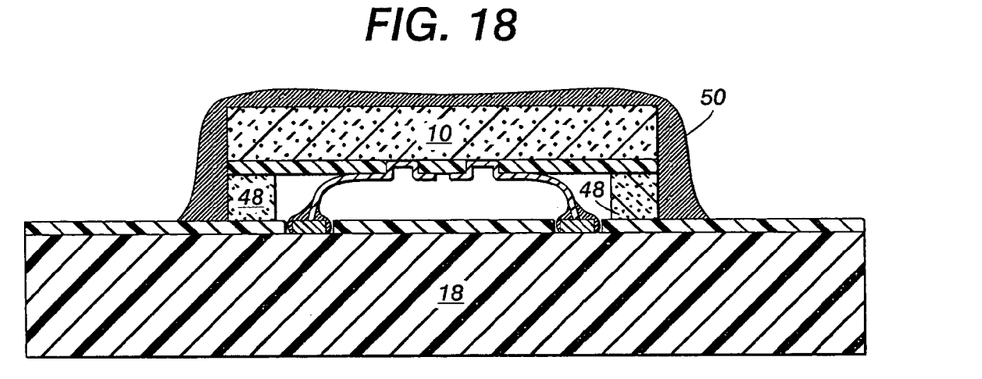

FIGS. 14 and 15 illustrate variations in which the capping mechanism is a heat sink 42 that improves thermal management. Essentially any type of connection, including those described above, can be used to secure the heat sink 42 to the IC die 10. FIG. 14 illustrates a technique using a nut and a bolt on one side and a spring clip of the other side. In other aspects, the nut and bolt or the spring clip can be used on both sides to secure the heat sink 42. In FIG. 18, the heat sink 42 is made out of solid copper or features a copper surface finish, and solder is used to secure it to the substrate 18. Since copper and FR4 or polyimide have close CTE, this connection can be achieved with minimal (including no) warping of the substrate 18.

Figure 16:
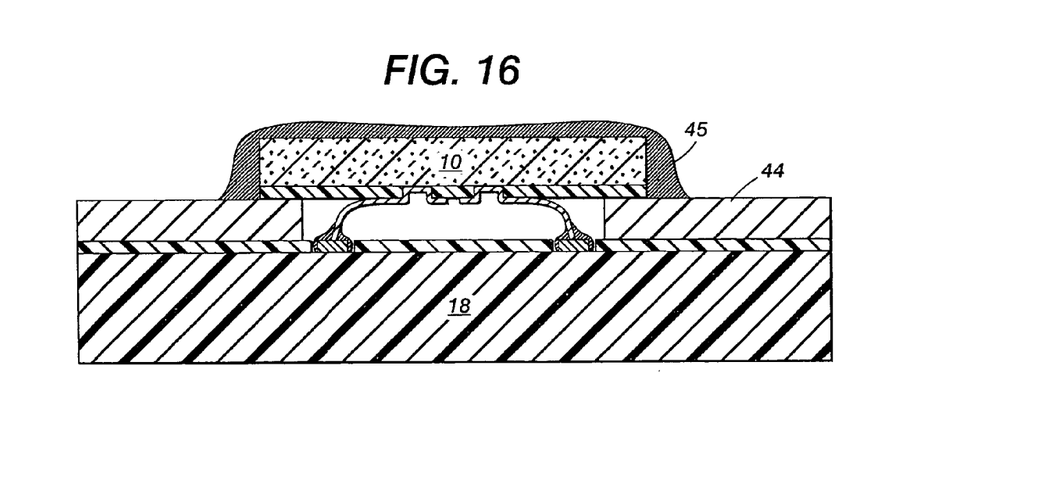
FIG. 16 illustrates an exemplary IC die/substrate assembly in which a film integrated on or laminated to the substrate defines the chip-to-substrate gap.

FIG. 16 illustrate an exemplary IC die/substrate assembly in which a film 44 integrated on or laminated to the substrate 18 defines the chip-to-substrate gap. In one instance, the film 44 is a solder mask film. A structure 45 (e.g., a glob top) secures the IC die 10 to the film 44. Alternatively, an edge adhesive (not shown) can be used to secure the IC die 10 to the film 44. In one instance, the thickness of the structure 45 is about 1.5 to 4 mil, which corresponds to the standoff size for a 100 to 270 um long claw type spring. The structure 45 can also be a semi-flexible glob (e.g., silicone) or a metal cap used to secure the IC die 10 to the substrate 18 and absorb external shear and impact forces. With this configuration, the assembled IC die/substrate assembly can be tested and reworked (if necessary) before the structure 45 is applied over the IC die 10. As depicted, the structure 45 is used to secure a single IC die 10. In other instances, the structure 45 can be used to cap an array of IC dies.

Figure 17:
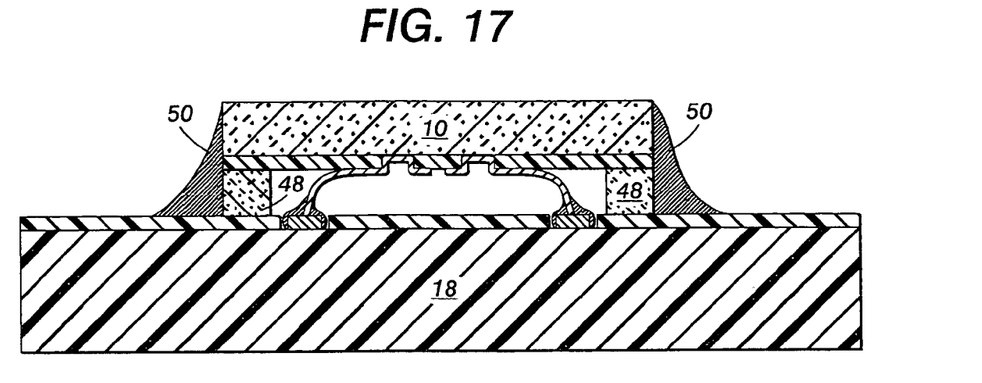
FIGS. 17 and 18 illustrate exemplary IC die/substrate assemblies in which a spacer if formed on the IC die prior to dicing.

FIGS. 17 and 18 illustrate a variation of the IC die/substrate assembly in which at least one spacer 48 is pre-processed as a grid on the IC die 10 prior to dicing. After assembly, the spacer 48 is allowed to move over the substrate 18 during thermocycling to avoid excessive stress buildup. A semi-flexible structure 50 (e.g., an edge adhesive, a glob, etc.) is applied to facilitate securing the IC die 10 to the substrate and/or absorbs thermal run-out and external shear forces. As depicted with respect to FIG. 17, the structure 50 can be applied to the edges of the IC die 10, and as depicted with respect to FIG. 18, the structure 50 can be applied over the IC die 10.

The spacer 48 can be a photo imaginable polymer, a plated metal, a second preprocessed die, etc. bonded to the IC die 10 with essentially any bonding technique (e.g., direct, anodic, intermediate, etc. bonding). For instance, a surface activated bonding, wherein an argon fast atom beam is applied to the films, can be used to bond and/or seal a variety of metals at room temperature, including aluminum (Al), copper (Cu), silver (Ag), gold (Au), tin-Indium (SnIn), titanium (Ti), nickel (Ni), to standard surfaces such as silicon nitride, silicon, aluminum oxide, etc.

Figure 19:
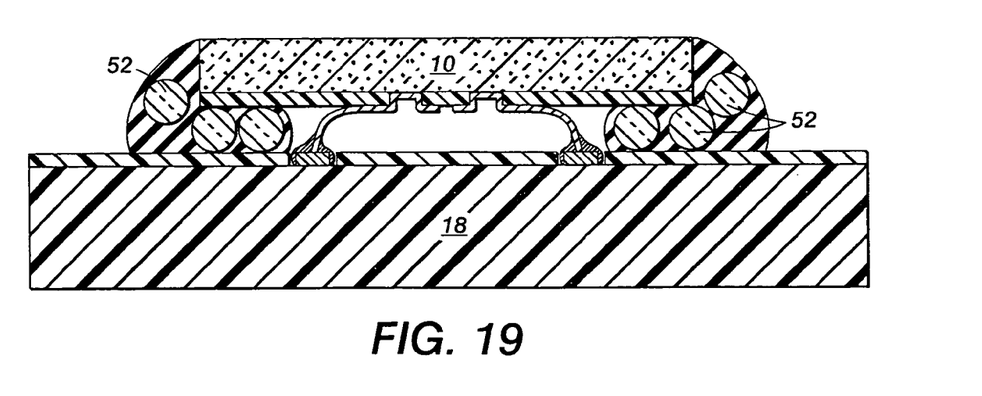
FIG. 19 illustrates an exemplary IC die/substrate assembly incorporating spacer beads in an adhesive applied to the chip corners or edges, or applied as a chip underfill.

FIG. 19 illustrates an IC die/substrate assembly incorporating spacer beads in an adhesive (e.g., silicone) applied to the chip corners or edges, or applied as a chip underfill. With this configuration, substantially uniformly sized spacer beads 52 are dispersed in a silicone in order to set the die-board gap. The flexible silicone absorbs the thermal run-out and external shear forces. The silicone can be metered to avoid oozing too far underneath the IC die 10 and interfering with the interconnect solder process.

Figure 20:
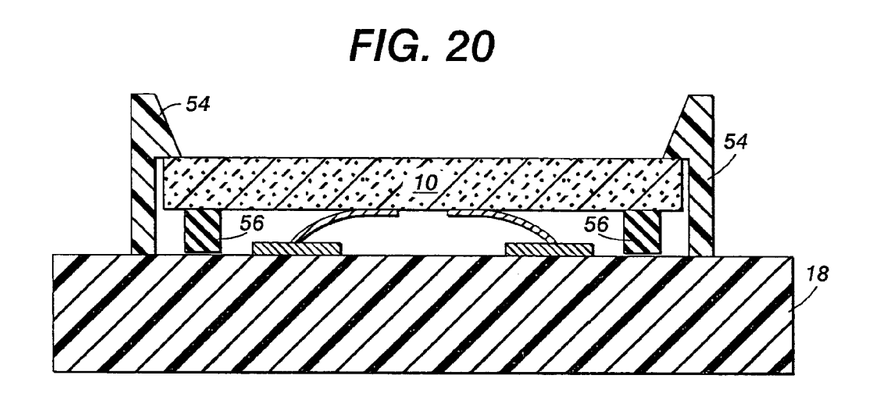
FIG. 20 illustrates an exemplary IC die/substrate assembly using a snap-in capping mechanism for pressure-contact packages.

FIG. 20 illustrates an IC die/substrate assembly using a snap-in mechanism 54 for pressure-contact packages. Using solder-free packages with pressure contact can reduce costs since no bumping line is needed and may be higher in compliance since there are no rigid bumps. The snap-in mechanism 54 is open during insertion of the IC die 10 and closes when the IC die 10 is in a suitable position with respect to the substrate 18. The arms of the snap-in mechanism 54 be similarly or differently shaped and/or may be fixed to either the substrate 18 or the IC die 10. As depicted, this IC die/substrate assembly can optionally include one or more compression stops 56, which can be formed from a metallic and/or polymeric material. With this configuration, the IC die 10 can be removed easily for reworking or replacement.

Figure 21:
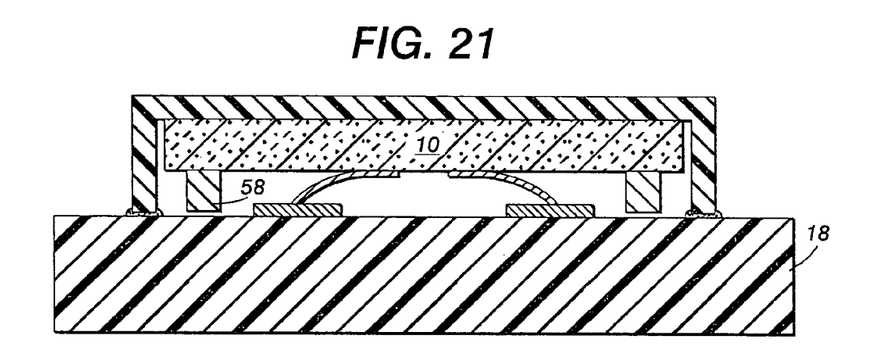
FIGS. 21-24 illustrate exemplary IC die/substrate assemblies with plated metal bumps for maintaining gap definition.
Figure 22:
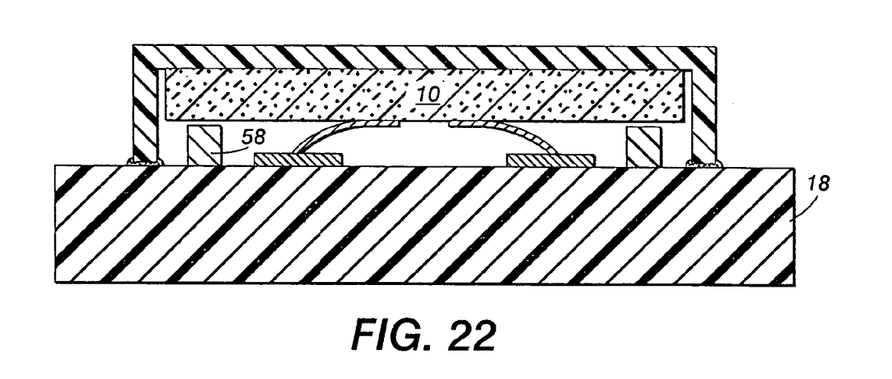
Figure 23:
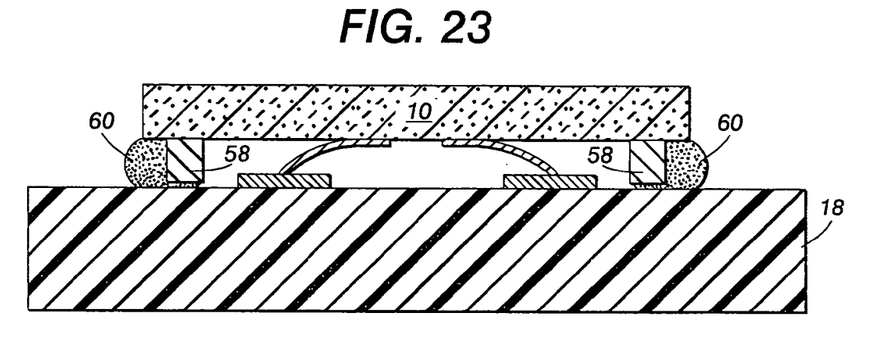
Figure 24:
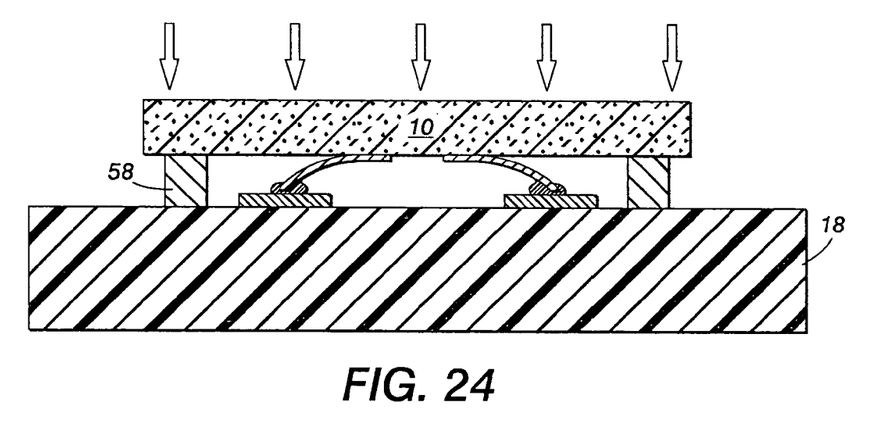

FIGS. 21, 22, 23, and 24 illustrate IC die/substrate assemblies with plated metal bumps 58 for gap definition. Using the plated metal bumps 58 mitigates increasing processing steps since such plating may already be used in fabricating the interconnect 16. In addition, no extra equipment or materials are needed. Furthermore, electroless and electroplating techniques allow for precise bump height control and bumps with heights between several microns and tens of microns. The bumps 58 can be easily produced on wafer scale and the-same plating equipment and materials can be used as for interconnection fabrication. The bumps 58 can be formed on the IC die 10 or the substrate 18. In FIG. 21, the metal bump 58 is formed on the IC die 10, and in FIG. 22, the metal bump 58 is formed on the substrate 18. The bumps 58 in FIGS. 21 and 22 can be used for gap definition. In FIG. 23, an adhesive 60 such as a glue, an epoxy, or the like is used in combination with a plated metal bump 58 for package fixation. In one instances, mechanical snaps or the like can be additionally or alternatively be used for package fixation. In FIG. 24, an external force can be applied during assembly to hold the IC die 10 and the substrate 18 together during soldering.

Figure 25:
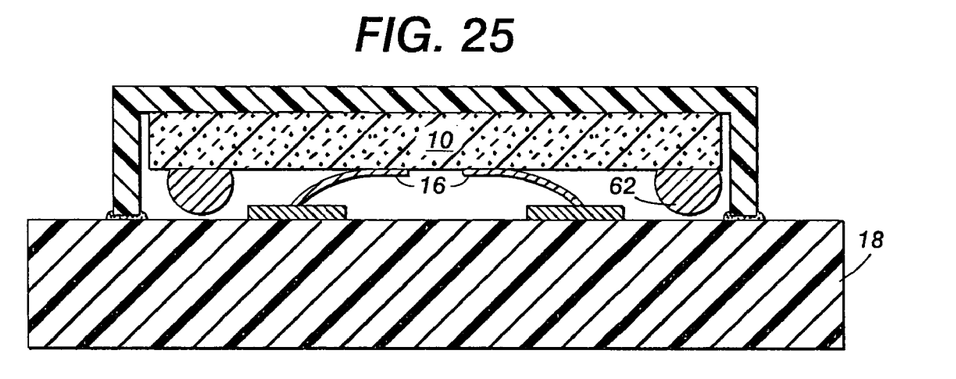
FIG. 25 illustrates an exemplary IC die/substrate assembly in witch one or more solder bumps are used for maintaining gap definition.

FIG. 25 illustrates an IC die/substrate assembly in witch one or more solder bumps 62 are used for gap definition. The one or more solder bumps 62 can be fabricated on either the IC die 10 (as depicted in FIG. 24) or the substrate 18 and act as a compression stop during assembly. After solder paste printing or solder plating the bumps 62 are reflowed and circular-shaped bumps that are well defined in height can be formed. The amount of solder paste and the pad size typically define the bump height. The solder bumps 62 can be screen-printed together with the solder for SMT components. Once any SMT components are placed and the substrate 18 is reflowed, the round shaped bumps determine a maximum compression during assembly. The IC die 10 with the interconnect 16 can then be assembled in a pick and place operation. An adhesive such as an epoxy, a glue, etc., a mechanical snap, and/or other connecting component can be used to hold the assembly together.

Figure 26:
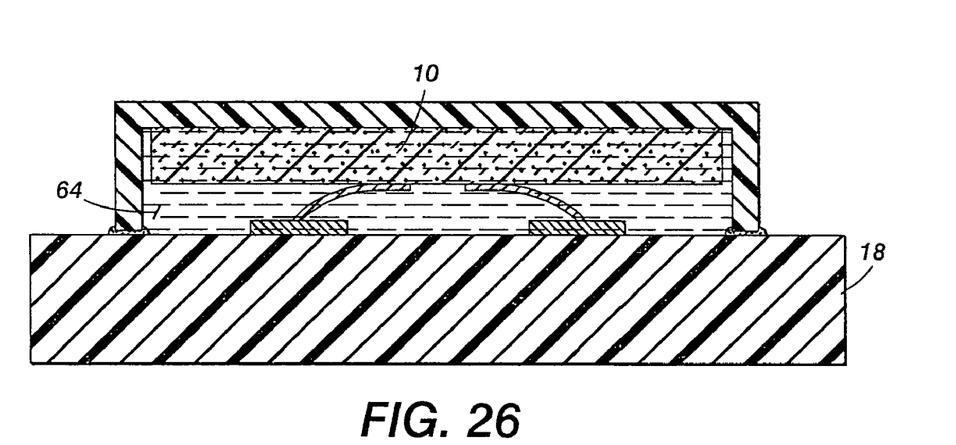
FIG. 26 illustrates an exemplary IC die/substrate assembly with a liquid underfilled package used as shock absorber and/or for die cooling.

FIG. 26 illustrates an IC die/substrate assembly with a liquid 64 underfilled within the package and used as shock absorber and/or for die cooling. The liquid 64 provides increased shock resistance and cooling performance. In one instance, a liquid 64 is an encapsulant such as a gel. The liquid 64 acts as a shock absorber and prevents the package from being sheared off during external impact forces. Concurrently, the liquid 64 facilitates heat distribution and/or dissipation from the IC die 10 to an external heat sink, metal cap, etc. Using a contact cleaning lubricant, like poly phenyl ether, can protect the long-term electrical performance of the interconnect 16 pressure contacts.

It is to be understood that one or more of the above described IC die/substrate assemblies provide at least one of the following: an accurate gap definition between an IC die and a substrate, a mechanical anchorage of an IC die and a substrate, a minimal restriction near an IC die perimeter, heat extraction, a reduction in the number of assembly steps, and a relatively easy rework to replace defective IC dies.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. An integrated circuit (IC) die/substrate assembly, comprising:
   an IC die;
   an interconnect that is a stressed metal spring biased out of the IC die with an internal mechanical stress;
   a substrate that is coupled to the interconnect to form an electrical connection between the IC die and the substrate; and
   at least one coupling that facilitates maintaining an IC die/substrate gap definition between the IC die and the substrate, coupled to the substrate by at least one of an adhesive and solder, the at least one coupling facilitating the interconnect self-aligning with the substrate and absorbing external forces exerted on the assembly;
   wherein the IC die is secured to the substrate through one or more of a snap-in mechanism, solder, glue, an adhesive, a cap, tape, a film, and a heat sink.

2. The IC die/substrate assembly as set forth in claim 1, wherein the at least one coupling is single-sided sticky tape that is formed on the IC die prior to the assembly being diced and coupled to the substrate through the sticky tape.

3. The IC die/substrate assembly as set forth in claim 1, wherein the interconnect is biased out of the substrate with an internal mechanical stress.

4. The IC die/substrate assembly as set forth in claim 1, wherein the IC die is mounted to the substrate upside-down in a flip chip configuration.

5. An integrated circuit (IC) die/substrate assembly, comprising:
   an IC die;
   an interconnect that is a stressed metal spring biased out of the IC die with an internal mechanical stress;
   a substrate that is coupled to the interconnect to form an electrical connection between the IC die and the substrate; and
   at least one coupling that facilitates maintaining an IC die/substrate gap definition between the IC die and the substrate, coupled to the substrate by at least one of an adhesive and solder, the at least one coupling facilitating the interconnect self-aligning with the substrate and absorbing external forces exerted on the assembly;
   wherein the at least one coupling is a metalized standoff formed on the IC die prior to the assembly being diced and coupled to the substrate through solder.

6. An integrated circuit (IC) die/substrate assembly, comprising:
   an IC die;
   an interconnect that is a stressed metal spring biased out of the IC die with an internal mechanical stress;
   a substrate that is coupled to the interconnect to form an electrical connection between the IC die and the substrate: and
   at least one coupling that facilitates maintaining an IC die/substrate gap definition between the IC die and the substrate, coupled to the substrate by at least one of an adhesive and solder, the at least one coupling facilitating the interconnect self-aligning with the substrate and absorbing external forces exerted on the assembly;
   wherein an adhesive is formed at at least one edge of the IC die to facilitate securing the IC die to the substrate.

7. The IC die/substrate assembly as set forth in claim 6, wherein the interconnect is biased out of the substrate with an internal mechanical stress.

8. An integrated circuit (IC) die/substrate assembly, comprising:
   an IC die;
   an interconnect that is a stressed metal spring biased out of the IC die with an internal mechanical stress;
   a substrate that is coupled to the interconnect to form an electrical connection between the IC die and the substrate; and
   at least one coupling that facilitates maintaining an IC die/substrate gap definition between the IC die and the substrate, coupled to the substrate by at least one of an adhesive and solder, the at least one coupling facilitating the interconnect self-aligning with the substrate and absorbing external forces exerted on the assembly;
   wherein the at least one coupling is formed from one or more of a polymer, a bonded wafer, a plated bump, a silicone, an adhesive embedded with one or more beads, and a reflowed solder bump.

9. The IC die/substrate assembly as set forth in claim 8, wherein the interconnect is biased out of the substrate with an internal mechanical stress.

10. An integrated circuit (IC) die/substrate assembly, comprising:
    an IC die;
    a stressed metal spring biased out of the IC die with an internal mechanical stress;
    a first substrate that is electrically coupled to the IC die through the stressed metal spring; and
    a second substrate to which the first substrate is coupled in order to form an electrical connection between the IC die and the second substrate, and at least one coupling that absorbs external forces exerted on the assembly.

11. The IC die/substrate assembly as set forth in claim 10, wherein one of the first and the second substrate includes a trench in which the IC die resides when the first and the second substrates are coupled together.

12. The IC die/substrate assembly as set forth in claim 10, wherein stressed metal spring is biased out of at least one of the first substrate and the second substrate with an internal mechanical stress.

13. The IC die/substrate assembly as set forth in claim 10, wherein one of more of the first and the second substrate is one of a metal core, glass epoxy, silicon, ceramic, and a Flame Resistant 4 (FR4) printed circuit board (PCB).

14. The IC die/substrate assembly as set forth in claim 10, wherein one of more of the first and the second substrate is one of a single and multi-layer PCB.

15. The IC die/substrate assembly as set forth in claim 10, wherein a cavity formed by coupling the first and the second substrates is filled with an encapsulating material.

16. The IC die/substrate assembly as set forth in claim 10, wherein at least one of a plated bump and a solder bump is formed on the IC die as a coupling prior to dicing and that absorb external forces exerted on the assembly.

17. The IC die/substrate assembly as set forth in claim 10, wherein the IC die is coupled to the substrate in a flip chip configuration.

18. A method for forming an IC die/substrate assembly, comprising:
    forming an IC die with a spring interconnect;
    forming at least one coupling on the die;
    electrically coupling the IC die to a substrate through the interconnect;
    mechanically coupling the IC die to the substrate through the at least one coupling to maintain a gap between the IC die and the substrate, to facilitate self-exerted alignment of the interconnect relative to the substrate, and to absorb external forces exerted on the assembly;
    applying one of an adhesive and solder between the at least one coupling and the substrate; and
    using the adhesive or solder to couple the at least one coupling to the substrate.

19. The method as set forth in claim 18, further including mounting the IC die to the substrate in a flip chip configuration.

20. An integrated circuit (IC) die/substrate assembly, comprising:
    an IC die;
    an interconnect that is a stressed metal spring biased out of the IC die with an internal mechanical stress;
    a substrate that is coupled to the interconnect to form an electrical connection between the IC die and the substrate; and
    at least one metalized stand-off coupling formed on the IC die prior to the assembly being diced and coupled to the substrate through solder, the coupling facilitating maintaining an IC die/substrate gap definition between the IC die and the substrate.

* * * * *

UNITED STATES PATENT AND TRADEMARK OFFICE
CERTIFICATE OF CORRECTION

PATENT NO. : 7,426,117 B2  Page 1 of 1
APPLICATION NO. : 11/314827
DATED : September 16, 2008
INVENTOR(S) : Koenraad F. Van Schuylenbergh et al.

It is certified that error appears in the above-identified patent and that said Letters Patent is hereby corrected as shown below:

Title Page, Item (73) should read
-- (73) Assignee: Palo Alto Research Center Incorporated, Palo Alto, CA (US) --.

Signed and Sealed this

Twenty-seventh Day of April, 2010

David J. Kappos
*Director of the United States Patent and Trademark Office*